United States Patent [19]

Miyamoto

[11] Patent Number: 4,876,588
[45] Date of Patent: Oct. 24, 1989

[54] SEMICONDUCTOR DEVICE HAVING CERAMIC PACKAGE INCORPORATED WITH A HEAT-RADIATOR

[75] Inventor: Takashi Miyamoto, Tokyo, Japan
[73] Assignee: NEC Corporation, Tokyo, Japan
[21] Appl. No.: 244,940
[22] Filed: Sep. 15, 1988
[30] Foreign Application Priority Data
   Sep. 16, 1987 [JP] Japan .................. 62/233108
[51] Int. Cl.⁴ .......................................... H01L 23/02
[52] U.S. Cl. ..................................................... 357/81
[58] Field of Search ........................ 357/81, 65, 67, 74
[56] References Cited
   U.S. PATENT DOCUMENTS
   3,686,539  8/1972  Schwartzman ................... 357/81
   4,172,261  10/1979  Tsuzuki et al. .................. 357/74
   4,319,264  3/1982  Gangulee et al. ................ 357/67
   4,611,238  9/1986  Lewis et al. ..................... 357/81
   4,829,403  5/1989  Harding ........................... 357/81

*Primary Examiner*—William L. Sikes
*Assistant Examiner*—Robert E. Wise
*Attorney, Agent, or Firm*—Helfgott & Karas

[57] ABSTRACT

A semiconductor device in which a heat-radiator is bonded by a resin film to a metal plate constituting a part of a package is disclosed. Gold plating layers are employed in bonding pads, outer leads and the die bonding portion of the package. However, from the surface of the metal plate to which the resin film is adhered, the gold plating layer is removed or excluded, and the resin film is adhered to an underlying nickel plating layer.

9 Claims, 3 Drawing Sheets

SEMICONDUCTOR DEVICE HAVING CERAMIC PACKAGE INCORPORATED WITH A HEAT-RADIATOR

BACKGROUND OF THE INVENTION

The present invention relates to a semiconductor device having a ceramic package incorporated with a heat-radiator, and more particularly, to a semiconductor device in which a heat-radiator is bonded to a package body by a resin film.

To dissipate effectively a heat generated in a semiconductor chip during the operation, a radiator or heat sink is attached to the ceramic package body in which the semiconductor chip is installed. The attachment of the radiator to the package can be conducted by screw means or solder bonding means. Further, to increase the efficiency of the attaching work and to minimize the adverse influence on the ceramic member of the package during the attaching work, a structure in which the radiator is attached to the package body by using a resin film as adhesive has been proposed by N. Honda et al. in U.S. Pat. No. 4,340,902. The proposed prior art structure, however, cannot achieve a sufficient attaching strength, that is, a sufficient bonding strength between the radiator and the package body, because the resin film as adhesive is adhered to a molybdenum surface of a composite metal plate fixed to a ceramic member of a package body. On the other hand, if the structure is conducted by conventional process steps in which a nickel plating is followed by a gold plating, the gold plating film is inevitably provided on the metal plate, and the resin film as adhesive is adhered to the gold plating film. In this case, also a sufficient bonding strength cannot be obtained. Further, if, in the prior art structure, a epoxy resin which shows a high hardness nature after heating cure is used, cracks are apt to be produced in the adhesive resin when a repetition of change in environment temperature between high and low levels, that is, temperature cycles is affected to the device. Consequently, a high reliable device could not be obtained.

SUMMARY OF THE INVENTION

Accordingly, an object of the present invention is to provide a semiconductor device in which a heat-radiator is reliably bonded by a resin film to a metal plate fixed to a ceramic substrate of a package with a sufficient bonding strength, and without producing cracks in the resin film.

According to the present invention, there is provided a semiconductor device which comprises a ceramic substrate having a through-hole, a plurality of terminals each including a first metallized layer of high melting point material formed on a surface of the ceramic substrate at a portion outside the through-hole and a first nickelplated layer covering the first metallized layer of the terminal, a plurality of bonding pads each including a second metallized layer of high melting point material formed on the surface of the ceramic substrate at another portion inside the through-hole, a second nickel-plated layer covering the second metallized layer of the bonding pad and a first gold-plated layer covering the second nickel-plated layer of the bonding pad, and a sealing film including a third metallized layer of high melting point material formed on the surface of the ceramic substrate surrounding the through-hole and a third nickelplated layer covering the third metallized layer of the sealing film, a plurality of leads connected to respective ones of the terminals, each lead including a lead body bonded to the first nickel-plated layer of the terminal by solder, a fourth nickel-plated layer covering the lead body and a second gold-plated layer covering the fourth nickel-plated layer of the lead, a metal plate including a metal plate substrate having first and second flat surfaces, the first surface being covered by a fifth nickel-plated layer and a third gold-plated layer being formed on the fifth nickel plated layer, the second surface being covered by a sixth nickel-plated layer so that any gold-plated layer is free from on the sixth nickel-plated layer, the metal plate being bonded to a sealing film by solder in such a manner that the metal plate closes the through-hole to form a recess defined by the metal plate and the through-hole and that the first flat surface of the metal plate substrate is located inside the recess and the second flat surface of the metal plate substrate is located outside the recess, a semiconductor chip provided within the recess and fixed to the metal plate on the first flat surface and a silicone resin film provided between a radiator and the metal plate and adhered to the radiator and to the sixth nickel-plated layer on the second flat surface of the metal plate substrate to bond the radiator to the metal plate. Favorably, the thickness of the silicone resin film ranges from 20 μm to 100 μm. The surface of the sixth nickel-plated layer may be converted to a thin nickel oxide film having the thickness of 1000 Å to 8000 Å. The sixth nickel-plated layer and/or the silicon resin film may extends above the side of the metal plate substrate and reach the sealing film or the ceramic substrate to cover the side of the metal plate substrate entirely. Further, the metal plate may include a seventh nickel-plated layer which is provided in advance on the entire surface of the metal plate substrate including the first and second flat surfaces and all side surfaces, and a portion of the seventh nickel-plated layer on the second flat surface of the metal plate substrate may be employed as the sixth nickel-plated layer for adhering the silicone resin film. Favorably, the second flat surface of the metal plate is a circular plan shape, so that the bonding area between the metal plate and the radiator becomes a circular shape.

DESCRIPTION OF THE EMBODIMENTS

Figure 1A:
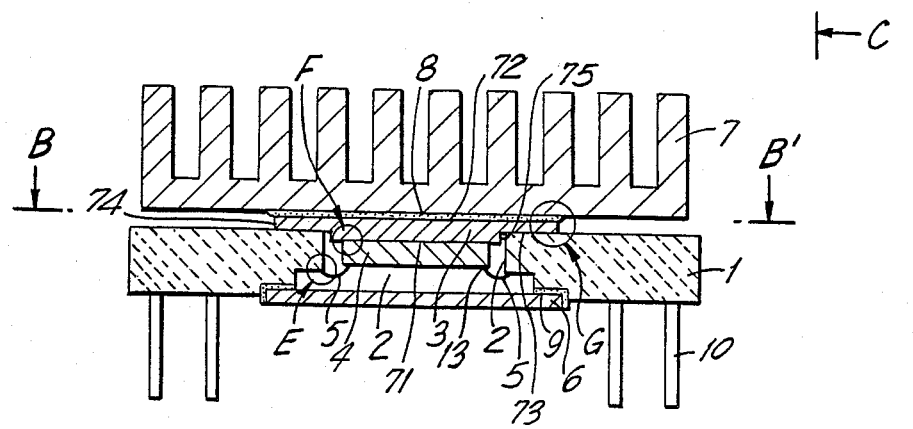
FIG. 1A is a cross-sectional view showing a semiconductor device of a first embodiment of the present invention.
Figure 1B:
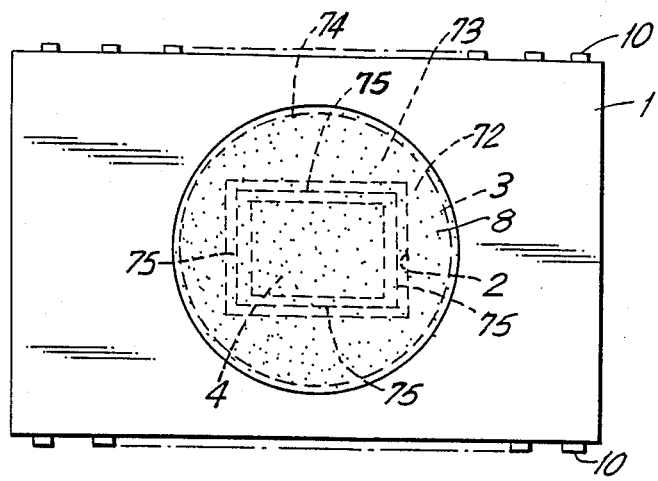
FIG. 1B is a cross-ectional view taken along line B—B' in FIG. 1A as viewed in the direction of arrows.
Figure 1C:
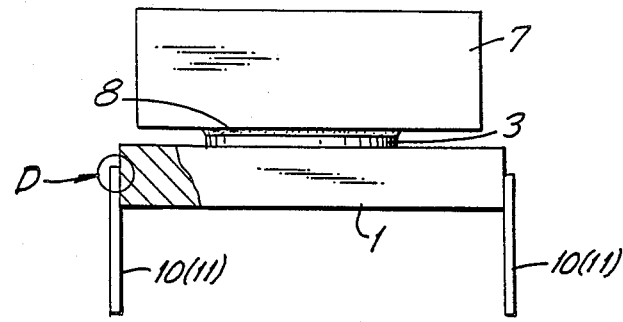
FIG. 1C is a side view inclduing a part of cross-sectional view, as viewed in the direction of arrows, C,C' in FIG. 1A.
Figure 1D:
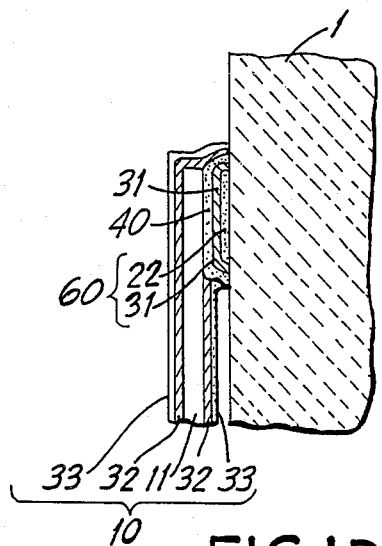
FIG. 1D is an enlarged cross-sectional view of an encircled part D in FIG. 1C.
Figure 1E:
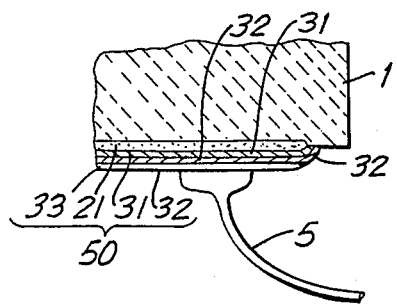
FIG. 1E is an enlarged cross-sectional view of an encircled part E in FIG. 1A.
Figure 1F:
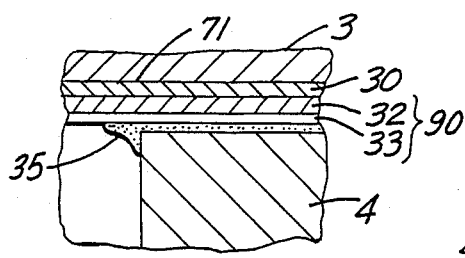
FIG. 1F is an enlarged cross-sectional view of an encircled part F in FIG. 1A.

Referring to FIGS. 1A to 1G, a first embodiment of the present invention will be explained. At a center portion of a ceramic substrate 1 consisting of alumina ($Al_2O_3$) as a principal component thereof, a through-hole 2 of rectangular or square plane shape is provided, and necessary metallized layers are simultaneously formed on and in the ceramic substrate 1 by well known thick film printing and baking method. The metallized layers can be formed by highly melting point material such as tungsten, molybdenum, maganese or palladium or mixture of two or more of these elements. On the exposed metallized layers 21 (FIG. 1E), 22 (FIG. 1D) and 23 (FIG. 1G), nickel layers 31 are simultaneously formed by a nickel electroplating method. The metallized layer 22 and the nickel plating layer 31 on the layer 22 constitute each terminal 60, and the metallized layer 23 surrounding the through-hole 2 and the nickel plating layer 31 on the layer 23 constitute a sealing film 70 surrounding the through-hole 2. Next, a metal plate 3 made of copper-tungsten composite alloy or the like and having a first flat surface 71 of rectangular shape defined by four straight side surfaces 75, a second flat surface 72 of large circle shape of 25 mm diameter defined by a circular side surface 74 and a flat stage surface 73 between the circular side surface 74 and the straight side surfaces 75, is brazed by using silver-copper composite alloy brazing material 40 as hard solder to the sealing film 70 at the flat stage 73 (FIG. 1G) in such a manner that the metal plate 3 closes one opening side of the through-hole 2 to form a recess by the metal plate 3 and the through-hole 2 (FIG. 1A). In this embodiment, a nickel plating layer 30 of 3 μm thickness is formed on the entire surfaces 71, 72, 73, 74 and 75 of the metal plate in advance. Also, during the brazing process step, lead bodies 11 of Fe (iron) - Ni (nickel) - Co (cobalt) composite alloy so called Kovar are bonded to respective terminals 60 located at the peripheral sides of the ceramic substrate I by the brazing material 40 (FIG. 1D). Next, nickel electroplating and gold electroplating are conducted in sequence to form a nickel plating layer 32 and a gold plating layer 33 on the first flat surface 71 of the metal plate 3 thereby providing a metal film 90 for die bonding constituted by plating layers 32, 33 (FIG. 1F), to form nickel plating layers 32 and gold plating layers 33 on the respective lead bodies 11 thereby providing a plurality of outer leads 10 each constituted by the lead body 11 and plating layers 32, 33 (FIG. 1D), and to form nickel plating layers 32 and gold plating layers 33 above the respective metallizing layers 21 thereby providing a plurality of bonding pads 50 each constituted by the metallizing layer 21 and plating layers 31, 32, 33 (FIG. 1E).

Figure 2:
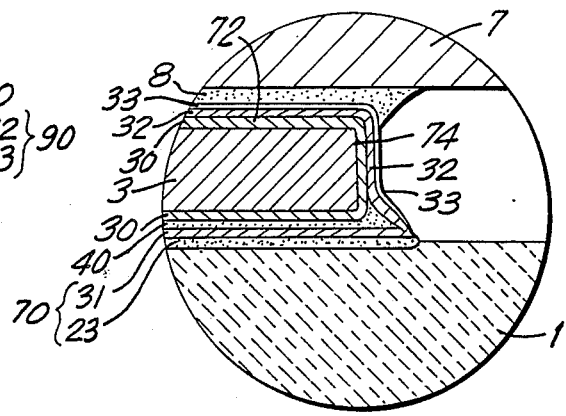
FIG. 2 is an enlarged cross-sectional view showing a same part as FIG. 1G, but shows a structure different from the present invention.

During the plating process steps mentioned above, a nickel plating layer 32 and a gold plating layer 33 are also formed on the second flat surface 72 and on the circular side surface 74 of the metal plate 3 as shown in FIG. 2. However, according to the present embodiment, the gold plating layer 33 on the surfaces 72, 74 of the metal plate 3 is selectively etched away under the condition of providing a mask member (not shown) on the other portions such as the metal film 90, the bonding pads 50, the outer leads 10, etc. Next, a semiconductor chip 4 is rigidly bonded by a gold-silicon solder 35 to the metal film 90 on the first flat surface 71 of the metal plate 3 within the recess. A portion of the gold plating layer 33 per se may be used as a solder in replace of the solder 35. Next, the bonding pads 50 and corresponding electrodes 13 (FIG. 1A) of the semiconductor chip 4 are connected each other by thin bonding wires 5, respectively. Next, a cap 6 is bonded to the ceramic substrate 1 by a glass member 9 having a low softening point to seal the semiconductor chip 4 and the associating members in the resin.

Figure 1G:
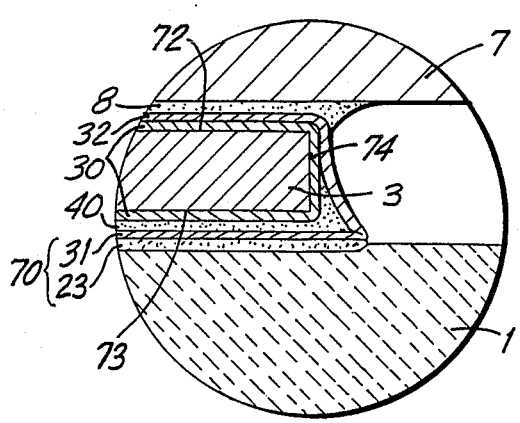
FIG. 1G is an enlarged cross-sectional view of an encircled part G in FIG. 1A.

Thereafter, a radiator 7 made of aluminum having a larger flat bottom surface than the second flat surface 72 of the metal plate 3 is bonded to the metal plate 3 by a silicone resin 8 of 50 μm thickness. As shown in FIG. 1G, the silicone resin 8 is adhered to the nickel plating layer 32 on the second flat surface 72 of the metal plate. Therefore, a high bonding strength can be obtained as compared to the structure shown in FIG. 2 in which the silicone resin film 8 is adhered to the gold plating layer 33. In FIG. 2, the same components as those in FIG. 1 are indicated by the same reference numerals. That is, in the structure of FIG. 2, separation may occur at the interface between the resin and the gold-plated surface during a mechanical environmental test such as a vibration or impact test, a thermal environmental test such as a thermal cycle test, or a moisture resistance test such as pressure cooker test. On the other hand, separation hardly occur at the interface between the resin and the nickel plated surface during various tests mentioned above. Further, according to the embodiment, the gold plating layer 33 is removed from the portion above the surfaces 72, 74 of the metal plate 3 at the step before the die (chip) bonding step. In this case, the exposed surface of the nickel plating layer 32 is converted to a thin nickel oxide film during subsequent heating steps i.e. die bonding step, wire bonding step and/or sealing step in the semiconductor device manufacturing process. It has, however, been found in the present invention that a nickel oxide film is dense and therefore not only prevents development of corrosion to the inside of the nickel layer but also improves the adhesion of the nickel layer to the resin, and it has been recognized that no problem arises from the nickel oxide film. It suffices to set the film thickness of the nickel layer at the same value as in the conventional arrangement, i.e., about 2 to 8 μm. The film thickness of the nickel oxide film ranging from 2000 Å to 8000 Å is more favorable on the adhesion and on the prevention of the corrosion, and the film thickness can be obtained by controlling the conditions of the heating steps mentioned above.

Specimens corresponding to FIG. 1G in which the nickel plating layer on the surface of the metal plate was exposed by the above-described method and a heat treatment was carried out for one hour in air at 450° C. to oxidize the surface of the exposed nickel layer, and specimens corresponding to FIG. 2 in which the gold plating layer covered the nickel plating layer so as to not expose the nickel surface were prepared. Thereafter, to each of specimens an aluminum radiator was bonded by a silicon resin film of about 50 μm and the circle bonding area of 50 mm diameter (about 490 mm² area). The bonding strength, in this case, bonding torque strength (Kg force.cm) was measured on each specimen. The results are shown in following Table 1.

TABLE 1

|  | bond | strength | (torque) | [kgf.cm] |
| --- | --- | --- | --- | --- |
| Au plating provided (FIG. 2) | 131.5, | 66.3, | 129.6, | 136.3 |
| No Au plating provided | 186.5, | 189.2, | 162.8, | 159.4 |

TABLE 1-continued

| | bond strength (torque) [kgf.cm] |
|---|---|
| (FIG. 1G) | |

Thus, the average value of measured strengths of bond to the surface of the gold (Au) plating layer is low and the bond strength in this case varies widely, whereas, in the case where the gold (Au) plating layer is removed to expose the surface of the nickel plating layer and the heat sink is bonded thereto, the average strength is high and variations in bond strength are small.

Further, silicone resin is rubber-like nature after heating cure. Therefore, any crack never occur in the resin film by heat cycling condition. Moreover, owing to circle bonding area shape, unfavorable stress concentration is hardly produced.

In the method mentioned above, the gold plating layer 33 on the metal plate 3 is selectively removed after entire gold plating. However, the following method may be employed. That is, after forming the nickel plating layer 32, a mask member (not shown) is provided only on the surfaces 72, 74 of the metal plate and gold electroplating is conducted to form gold plating layers except above the surfaces 72, 74 of the metal plate 3.

Figure 3:
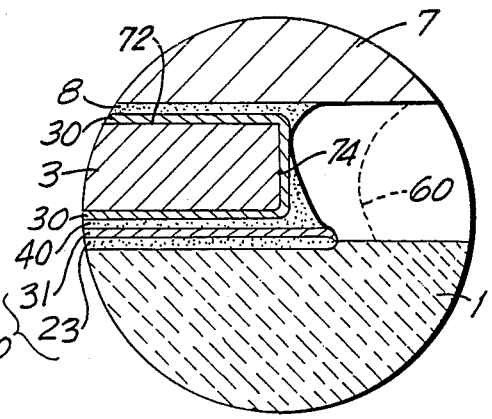
FIG. 3 is an elarged cross-sectional view showing a same part as FIG. 1G, and shows a second embodiment of the present invention.

Referring to FIG. 3, a second embodiment of the present invention will be explained. In FIG. 3, the same components as those in FIG. 1 are indicated by the same reference numerals. As described above, the metal plate 3 is brazed to the ceramic substrate 1 through nickel platings provided on the respective surfaces of the two, that is, there is the nickel plating layer 30 on the surface of the metal plate 3 in advance. Therefore, it is unnecessary to carry out plating to provide the nickel layer 32 on the surfaces 72, 74 of the metal plate 3, and the nickel layer 30 on the metal plate 3 beforehand can be utilized to obtain the same level of bond strength of the radiation 7 as the above. In this case, however, the silver/copper brazing material 40 is exposed and therefore may corrode if the service environment of the semiconductor device is bad. Accordingly, it is necessary to slect a service environment when this embodiment is utilized. The arrangement may be such that the amount of resin 8 is increased so that the resin 8 extends as far as the position shown by the chain line 60 to thereby cover the surface of the silver/copper brazing material.

As has been described in detail, the gold plating is removed from or no gold plating is applied to that surface of a metal plate to which a radiator is to be bonded to thereby expose the nickel-plated surface and the radiator is bonded to the exposed surface by means of a resin, whereby it is possible to improve the bond strength by a large margin.

What is claimed is:

1. A semiconductor device comprising;
   a ceramic substrate having a through-hole, a plurality of terminals each including a first metallized layer of high melting point material formed on the surface of said ceramic substrate at a portion outside said through-hole and a first nickel-plated layer covering said first metallized layer of said terminal, a plurality of bonding pads each including a second metallized layer of said high melting point material formed on the surface of said ceramic substrate at a portion inside said through-hole, a second nickel-plated layer covering said second metallized layer of said bonding pad and a first gold-plated layer covering said second nickel-plated layer of said bonding pad, and a sealing film including a third metallized layer of said high melting point material formed on the surface of said ceramic substrate surrounding said through-hole and a third nickel-plated layer covering said third metallized layer of said sealing film;
   a plurality of leads connected to respective said terminals, each lead including a lead body bonded to said first nickel-plated layer of said terminal by solder, a fourth nickel-plated layer covering said lead body and a second gold-plated layer covering said fourth-nickel plated layer of said lead,
   a metal plate including a metal plate substrate having first and second flat surfaces, said first surface being covered by a fifth nickel-plated layer and a third goldplated layer on said fifth nickel-plated layer, said second surface being covered by a sixth nickel-plated layer so that any gold plating layer is free from on said sixth nickel-plated layer, said metal plate being bonded to said sealing film by solder in such a manner that said metal plate closes one side opening of said through-hole to form a recess defined by said metal plate and said through-hole and that said first flat surface of said metal plate substrate is located inside said recess and said second flat surface of said metal plate substrate is located outside said recess;
   a semiconductor chip provided within said recess and fixed to said metal plate on said first flat surface;
   a heat-radiator; and
   a silicone resin film provided between said radiator and said metal plate and adhered to said radiator and to said sixth nickel-plated layer on said second flat surface of said metal plate substrate to bond said radiator to said metal plate.

2. A semiconductor device of claim 1, in which said silicone resin film has the thickness ranging from 20 μm to 100 μm.

3. A semiconductor device of claim 1, in which the surface of said sixth nickel-plated layer is converted to a thin nickel oxide film.

4. A semiconductor device of claim 3, in which said thin nickel oxide film has the thickness ranging from 1000 Å to 8000 Å.

5. A semiconductor device of claim 1, in which said sixth nickel-plated layer extends above the side of said metal plate substrate and reaches to said sealing film.

6. A semiconductor device of claim 1, in which said silicone resin film extends above the side of said metal plate substrate and reaches to said ceramic substrate.

7. A semiconductor device of claim 1, in which said metal plate further including a seventh nickel-plated layer provided on the entire surfaces of said metal plate substrate.

8. A semiconductor device of claim 7, in which a portion of said seventh nickel-plated layer on said second flat surface of said metal plate substrate is employed as said sixth nickel-plated layer for adhering said silicone resin film.

9. A semiconductor device of claim 1, in which said second flat surface of said metal plate has a circular shape.

* * * * *